(12) United States Patent
Marty

(10) Patent No.: US 6,465,317 B2
(45) Date of Patent: Oct. 15, 2002

(54) PROCESS FOR PRODUCING A BIPOLAR TRANSISTOR WITH SELF-ALIGNED EMITTER AND EXTRINSIC BASE

(75) Inventor: Michel Marty, St. Paul de Varces (FR)

(73) Assignee: STMicroelectronics S.A., Montrouge (FR)

( * ) Notice: Subject to any disclaimer, the term of this patent is extended or adjusted under 35 U.S.C. 154(b) by 62 days.

(21) Appl. No.: 09/766,454

(22) Filed: Jan. 19, 2001

(65) Prior Publication Data

US 2001/0039095 A1 Nov. 8, 2001

(30) Foreign Application Priority Data

Jan. 21, 2000 (FR) .............................. 00 00791

(51) Int. Cl.[7] ................... H01L 21/331; H01L 21/8222
(52) U.S. Cl. ........................ 438/321; 438/366
(58) Field of Search ................... 438/321, 366

(56) References Cited

U.S. PATENT DOCUMENTS 5,093,272 A    3/1992  Hoepfner et al. ........... 438/321
5,204,277 A  * 4/1993  Somero et al. ...... 148/DIG. 10

FOREIGN PATENT DOCUMENTS

EP    0 374 036    6/1990
EP    0 387 010    9/1990
FR    2 779 572    12/1999

OTHER PUBLICATIONS

European Patent Abstract of Japanese Publication No. 01270270 published on October 27, 1989.
European Patent Abstract of Japanese Publication No. 08097229 published on Apr. 12, 1996.
Preliminary Search Report dated Sep. 11, 2000 for French Patent Application No. 0000791.

* cited by examiner

*Primary Examiner*—Trung Dang
*Assistant Examiner*—William M. Brewster
(74) *Attorney, Agent, or Firm*—Jose Gutman; Lisa K. Jorgenson; Fleit, Kain, Gibbons, Gutman & Bongini P.L.

(57) ABSTRACT

A transistor manufacturing process includes the formation, on a layer (15) that will form the base of the transistor, of a stack of an SiGe alloy layer (16), a silicon oxide layer (17) and a silicon nitride layer (18), so as to form in this layer, a false emitter (20), to form, in the layer (15) that will form the base, an extrinsic base region (22) and to siliconize the surface of this extrinsic base region, to cover the extrinsic base region (22) and the false emitter (20) with a silicon dioxide layer (24) which is chemically and mechanically polished down to the level of the false emitter (20), to etch the false emitter (20) in order to form a window (25) and to form, in the window (25) and on the silicon dioxide layer (24), a polysilicon emitter (27). This process has particular application to manufacturing heterojunction bipolar transistors.

37 Claims, 2 Drawing Sheets

PROCESS FOR PRODUCING A BIPOLAR TRANSISTOR WITH SELF-ALIGNED EMITTER AND EXTRINSIC BASE

CROSS-REFERENCE TO RELATED APPLICATIONS

This application is based upon and claims priority from prior French Patent Application No. 0000791, filed on Jan. 21, 2000, the entire disclosure of which is herein incorporated by reference.

BACKGROUND OF THE INVENTION

1. Field of the Invention

The present invention generally relates to the field of manufacturing bipolar transistors, and more particularly to a process for manufacturing a bipolar transistor with an emitter that is self-aligned with respect to an extrinsic base of the transistor, such as for a heterojunction bipolar transistor.

2. Description of the Prior Art

Conventionally, the fabrication of a bipolar transistor comprises the following successive steps:

the production in a semiconductor substrate, for example a p-type silicon substrate, of a buried extrinsic collector layer, for example a layer $n^+$-doped by arsenic implantation;

the production on either side of the extrinsic collector of two buried isolation layers, for example $p^+$-doped by boron implantation;

the production by thick epitaxy, on the substrate thus formed, of a layer of single-crystal silicon, for example of the n type;

the production in the thick single-crystal silicon layer of a lateral isolation region, either by a local oxidation (LOCOS) process or one of the "shallow trench" type, in order to define an intrinsic collector region in the thick silicon layer;

the production of a collector well, for example $n^+$-doped, especially by phosphorus implantation, which contacts the buried extrinsic collector layer;

the production under the lateral isolation region of wells, for example p-doped by boron implantation, in order to isolate the bipolar transistor from the adjacent transistors;

the formation of a thin layer of thermal oxide, typically $SiO_2$, on the surface of the intrinsic collector region;

the formation of an amorphous silicon layer on the surface of the thermal oxide layer and of the lateral isolation region;

the plasma etching in the amorphous silicon layer of a window called a "base window", which etching stops on the thermal oxide layer;

the chemical deoxidation of the thermal oxide layer laying above the intrinsic collector region and exposed by the base window;

the formation by non-selective epitaxy of a layer, typically an Si/SiGe alloy/Si three-layer stack, in which the future intrinsic base of the transistor will be produced;

the formation, on the stack of the intrinsic base, of an insulation layer by depositing tetraethylorthosilicate (TEOS) and then by depositing a nitride layer;

the production by means of a resin mask, on the layer for forming the intrinsic base, in the insulation layer, of an emitter window lying above the intrinsic collector region;

the production of a polycrystalline silicon (polysilicon) emitter by chemical vapor deposition and etching by means of a photolithography mask;

the formation of the extrinsic base and the connection contacts. Such a conventional process for fabricating a bipolar transistor is described, among others, in French Patent No. 98/07059.

One drawback with the conventional processes, like that which has just been described, is that they require the use of at least three masks. This multiplicity of masking, because of the tolerances, does not allow self-alignment of the extrinsic base and the emitter to be obtained. This lack of self-alignment is further aggravated by the density and the dimensions desired for the apertures (windows).

Accordingly, there exists a need for overcoming the disadvantages of the prior art as discussed above, and more specifically for a process for producing a bipolar transistor that remedies the drawbacks of the processes in the prior art.

SUMMARY OF THE INVENTION

A preferred embodiment of the present invention comprises a process for producing a bipolar transistor allowing self-alignment of the extrinsic base and the emitter.

A significant advantage of the invention is that the process for producing a bipolar transistor, according to a preferred embodiment of the present invention, requires two masking steps instead of the usual three.

Preferably, the process produces a bipolar transistor while reducing the problems associated with the density and the dimensions of the apertures (windows).

According to the invention, the process for producing a bipolar transistor, the emitter of which is self-aligned with the extrinsic base, comprises the following steps:

the production of a structure comprising a semiconductor substrate in which an extrinsic collector, insulating layers of the extrinsic base, a lateral isolation region and an intrinsic collector region are formed, the said structure having a main surface on which an amorphous silicon layer, defining a base window in the intrinsic collector region, and a layer that will form the future base of the transistor and covering the amorphous silicon layer and the base window, are deposited, the successive deposition, on the layer that will form the future base of the transistor, of an SiGe alloy layer, a thin silicon oxide layer and a silicon nitride layer;

the etching by means of a mask of the silicon nitride layer, the silicon oxide layer and the SiGe alloy layer in order to form, on the layer that will form the future base of the transistor, above the intrinsic collector region, a false emitter of geometry and dimensions corresponding to the desired geometry and dimensions of the final emitter;

the formation of spacers on the two opposite sides of the false emitter;

the formation of an extrinsic base region in the layer that will form the future base of the transistor;

the formation of a metal silicide layer on the extrinsic base region;

the deposition of a thick silicon dioxide layer so as to cover the metal silicide layer and the false emitter;

the chemical-mechanical polishing of the thick silicon dioxide layer down to the level of the false emitter;

the etching of the false emitter layers in order to form an emitter window;

the deposition of a polysilicon layer filling the emitter window and covering the thick silicon dioxide layer; and the etching, by means of a mask, of the polysilicon layer in order to complete the emitter.

The process according to a preferred embodiment of the present invention comprises only two masking steps, for the etching of the false emitter and the final etching of the emitter.

The operations of depositing the SiGe alloy, silicon oxide and silicon nitride layers, and the operations of etching these layers, are conventional and well known in the art.

For example, the SiGe alloy layer may be deposited by non-selective epitaxy. Preferably, the SiGe alloy has a high germanium content, typically 15 to 50%, and preferably 20 to 50%, the etching selectivity with respect to silicon increasing with the germanium content. The thickness of the SiGe alloy layer is generally about 20 to 50 nm.

The thin oxide layer may be deposited by plasma-enhanced chemical vapor deposition (PECVD) using an alkyl silicate such as tetraethylorthosilicate (TEOS). This layer generally has a thickness of 30 to 40 nm.

The silicon nitride layer may be formed in a conventional manner by PECVD deposition. This silicon nitride layer must have a thickness corresponding to the desired thickness of the final polycrystalline silicon (polysilicon) emitter. This thickness, in the case of a BiCMOS structure, must also be sufficient to take into account the gate thickness and the subsequent chemical-mechanical polishing. In general, the thickness of the silicon nitride layer is from 200 to 300 nm, typically about 250 nm.

The operations of etching the silicon nitride, silicon oxide and SiGe alloy layers in order to form the stack forming the false emitter, and the operation of etching these same layers in the stack of the false emitter, may be carried out by any conventional process well known in the art. This etching may be carried out using a plasma, for example an $NF_3$/He gaseous plasma. Lateral overetching of the SiGe alloy layer is possible depending on the final dimensions of the emitter and on the above photolithography.

Because of the fact that the mask used for forming the false emitter by lithography is not a hole but a block of resin, very precise etching of the false emitter, and consequently of the emitter, is obtained.

Chemical-mechanical polishing with detection of the silicon oxide/silicon nitride interface is known.

Chemical-mechanical polishing is described, inter alia, in the article "Chemical Mechanical Planarization of Microelectronics Materials" by Joseph M. STEIGERWALD-SHYAMP-MURARKA-John WILEY, New York, pp. 273, (1997).

The process, according to a preferred embodiment of the invention, allows a bipolar transistor to be produced in which the emitter is defined by photolithography and is self-aligned with the extrinsic base.

Furthermore, a base produced by non-selective epitaxy is used.

The process of the invention is compatible with bipolar and BiCMOS technologies.

BRIEF DESCRIPTION OF THE DRAWINGS

Advantages and features of the invention will become more apparent on examination of the description of the preferred embodiments, which are entirely non-limiting, and of the appended drawing figures that show, respectively.

DESCRIPTION OF THE PREFERRED EMBODIMENTS

Figure 1A:
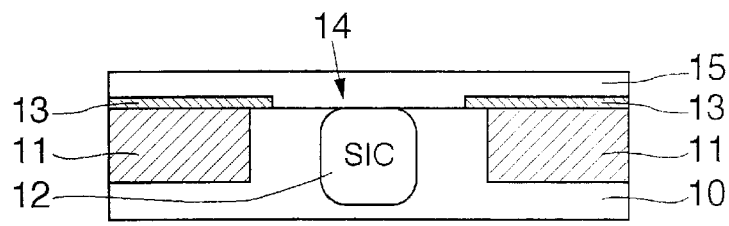
FIGS. 1a to 1g—the main steps of a process for producing a bipolar transistor, according to the preferred embodiments of the present invention.

Referring to the figures, particularly to FIG. 1a, the first step of the process consists in obtaining or producing, in a conventional manner, a structure comprising a single-crystal silicon substrate 10 having a lateral isolation region 11 and an intrinsic collector region 12 bounded by the lateral isolation region 11.

Although not appearing in the figures for the sake of simplification, the substrate 10 also includes a buried extrinsic collector layer and layers for isolating the extrinsic collector, and a collector well in order to reduce the collector access resistance.

The formation of these layers and regions is conventional and is described inter alia in French Patent No. 98/07059.

Also conventionally, the structure comprises, on the upper surface of the substrate 10, an amorphous silicon layer 13 defining a base window 14 in the intrinsic collector region 12. The formation of such a silicon oxide layer is conventional and is described in the abovementioned French Patent.

A layer 15 that will form the future base of the transistor is formed on the window 14 and the $SiO_2$ layer 12.

This layer 15 preferably consists of a stack comprising a first layer of undoped silicon having a thickness of a few tens of nanometers, a second layer of an SiGe alloy and a third layer of silicon, for example p-doped, generally having a thickness of about 25 nm. In fact, the SiGe alloy layer is preferably formed from two sublayers, a first sublayer having a fixed germanium content (10 to 20%) surmounted by a second sublayer made of an SiGe alloy (whose germanium content decreases, for example down to zero) and which is doped, for example p-doped with boron. Typically this second SiGe alloy layer has a thickness of 20 to 100 nm.

The fabrication of such a layer 15 that will form the future base of the transistor is conventional and can be carried out, for example, by non-selective epitaxy.

For further details as regards the production of this layer that will form the base, reference may be made to the abovementioned French patent.

Figure 1B:
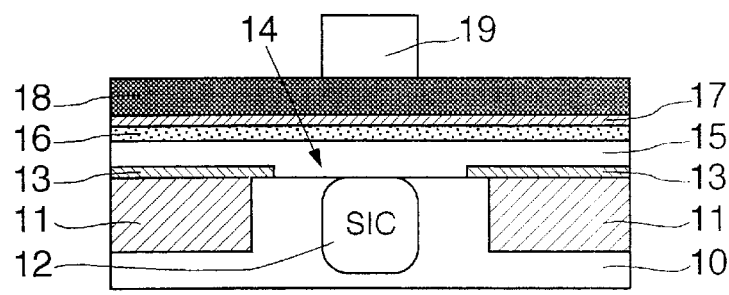
Figure 1C:
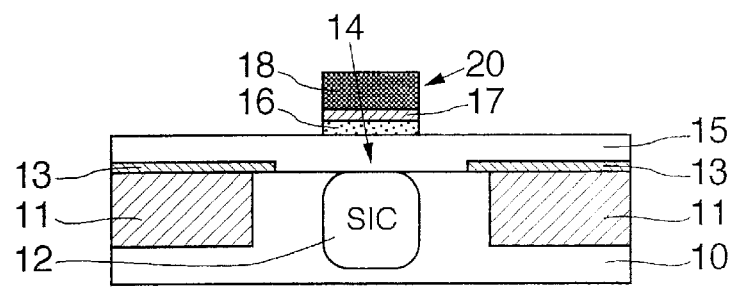

As shown in FIG. 1b, the following are then formed in succession on the layer 13: an SiGe alloy layer 16 having a high germanium content (15 to 50%) and a thickness of 20 to 50 nm, then a silicon oxide layer 17 having a thickness of 30 to 40 nm and finally a silicon nitride ($Si_3N_4$) layer 18 having a thickness of about 250 nm.

These layers are formed conventionally, for example by non-selective epitaxy for the SiGe alloy layer 16, plasma-enhanced chemical vapor deposition (PECVD) for the $SiO_2$ layer 17, using tetraethylorthosilicate (TEOS) as precursor, and by PEVCD deposition for the $Si_3N_4$ layer 18 with $SiH_4$ and $NH_3$ as precursor gases.

A resin mask 19 is then formed on the last layer 18 above the intrinsic collector region.

The three, silicon nitride 18, $SiO_2$ 17 and SiGe alloy 16, layers are then conventionally etched by means of the mask 19 so as, after removing the resin mask 19, to obtain, on the layer 15 that will form the future base of the transistor, a false emitter 20 consisting of a stack of the above three layers having the shape and dimensions corresponding to the final emitter of the transistor.

The etching of the three layers may be carried out by firstly etching the $Si_3N_4$ layer 18, stopping on the $SiO_2$ layer 17, for example by means of a plasma, then by etching the $SiO_2$ layer 17, stopping on the SiGe alloy layer 16, for example by means of a plasma containing fluorinated compounds, and finally by selective etching with respect to the SiGe alloy layer 16, for example by means of an $NF_3$/He plasma.

Figure 1D:
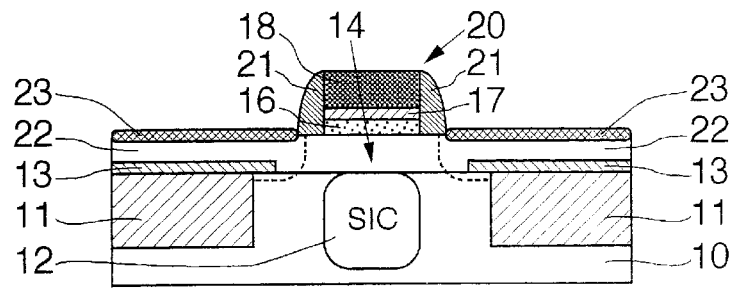

As shown in FIG. 1d, spacers 21, for example made of $SiO_2$, are then formed in a manner known per se on two opposite sides of the stack of the false emitter 20.

Next, as is well known, the process continues with the formation of the extrinsic base 22. For example, this formation of the extrinsic base 22 may be carried out by conventional boron implantation.

The surface of the extrinsic base 22 is silicided 23 in a manner known per se, for example using a technique of the "self-aligned silicide" type which comprises the deposition of a layer of metal (for example Ti) in order to form a silicide ($TiSi_2$) on the extrinsic base 22.

Figure 1E:
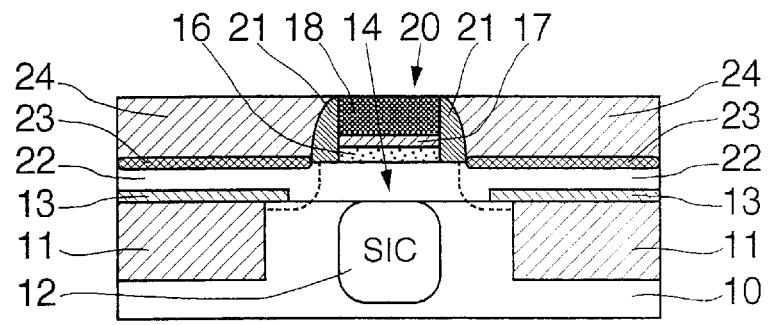

As shown in FIG. 1e, a thick silicon oxide layer 24 covering the extrinsic base 22 and the false emitter 20 is then formed and this layer then undergoes chemical-mechanical polishing, stopping on the silicon nitride layer 18 of the false emitter 20. The deposition of such a thick $SiO_2$ layer and the chemical-mechanical polishing of this layer are known per se.

The silicon oxide layer 24 must be thick enough to completely cover the false emitter 20, i.e. generally about 500 nm or more.

Figure 1F:
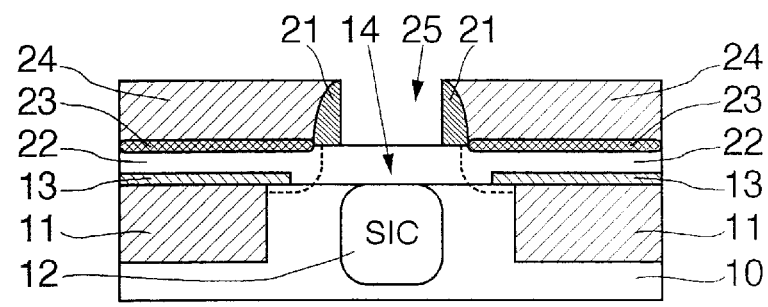
Figure 1G:
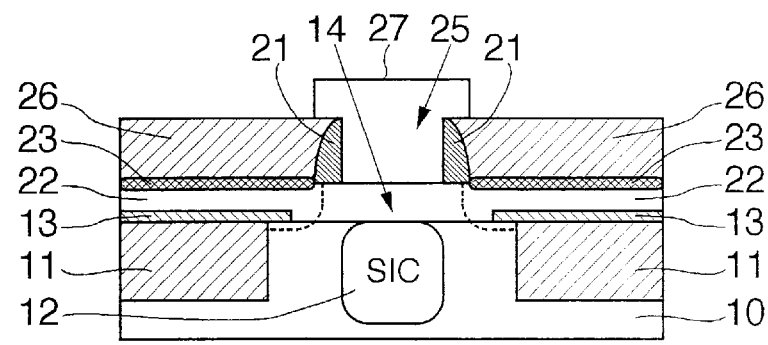

After chemical-mechanical polishing, the layers of the false emitter 20 are selectively etched, in a manner known per se, in order to form an emitter window 25 (FIG. 1f).

As this stage, the process may optionally continue with a selective overdosing of the intrinsic collector 12 (Selective Implantation Collector) under the emitter window 25 in one or more implantation operations, thus having to increase the speed of the transistor by reducing the resistance of the collector. An overdoped zone SIC is therefore obtained under the emitter window 25.

Next, the emitter window 25 is preferably cleaned, for example by means of a 1% HF solution for 1 minute, in order to obtain a chemically clean single-crystal silicon surface.

To further improve the surface finish of the silicon, it may be advantageous to carry out a desorption treatment under hydrogen at high temperatures ($\geq 550°$ C.) in order to remove the residual impurities.

A conventional CVD deposition of a polysilicon layer is then carried out, this layer filling the emitter window 25 and covering the silicon oxide layer 26, followed by conventional photolithographic etching of this polysilicon layer in order to form the polysilicon emitter having the desired shape and dimensions.

The bipolar transistor is completed in a conventional manner by producing the emitter connection contacts.

While there has been illustrated and described what are presently considered to be the preferred embodiments of the present invention, it will be understood by those of ordinary skill in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A process for producing a bipolar transistor with self-aligned emitter and extrinsic base, the process comprising the steps of:

producing a structure comprising a semiconductor substrate in which an extrinsic collector, a lateral isolation region and an intrinsic collector region are formed, the structure having a main surface on which an amorphous silicon layer, defining a base window in the intrinsic collector region, and a layer that will form the future base of the transistor and covering the amorphous silicon layer and the base window, are deposited;

successively depositing, on the layer that will form the future base of the transistor, an SiGe alloy layer, a thin silicon oxide layer, and a silicon nitride layer;

etching, by means of a mask, the silicon nitride layer, the silicon oxide layer, and the SiGe alloy layer, in order to form, on the layer that will form the future base of the transistor, above the intrinsic collector region, a false emitter of geometry and dimensions corresponding to the desired geometry and dimensions of the final emitter;

forming spacers on two opposite sides of the false emitter;

forming an extrinsic base region in the layer that will form the future base of the transistor;

forming a metal silicide layer on the extrinsic base region;

depositing a thick silicon dioxide layer so as to cover the metal silicide layer and the false emitter;

chemical-mechanical polishing of the thick silicon dioxide layer down to the level of the false emitter;

etching the false emitter in order to form an emitter window;

depositing a polysilicon layer filling the emitter window and covering the thick silicon dioxide layer; and etching, by means of a mask, the polysilicon layer in order to complete the emitter.

2. The process according to claim 1, wherein the SiGe alloy comprises 10% to 50% of germanium.

3. The process according to claim 1, wherein the SiGe alloy layer has a thickness of 20 to 50 nm.

4. The process according to claim 1, wherein the thin silicon oxide layer is formed by plasma-enhanced chemical vapor disposition.

5. The process according to claim 1, wherein the thin silicon dioxide layer has a thickness of 30 to 40 nm.

6. The process according to claim 1, wherein the silicon nitride layer is formed by plasma-enhanced chemical vapor deposition.

7. The process according to claim 1, wherein the silicon nitride layer has a thickness of 200 to 300 nm.

8. The process according to claim 1, wherein the etching of the false emitter is plasma etching.

9. The process according to claim 8, wherein the various layers of the layer that will form the future base of the transistor are formed by non-selective epitaxy.

10. The process according to claim 1, wherein the layer that will form the future base of the transistor comprises a stack of a first layer of amorphous silicon, a second layer of SiGe alloy and a third layer of doped silicon.

11. The process according to claim 1, wherein the SiGe alloy layer is formed by non-selective epitaxy.

12. The process according to claim 11, wherein the SiGe alloy layer has a thickness of 20 to 50 nm.

13. The process according to claim 11, wherein the thin silicon oxide layer is formed by plasma-enhanced chemical vapor disposition.

14. The process according to claim 11, wherein the thin silicon dioxide layer has a thickness of 30 to 40 nm.

15. The process according to claim 11, wherein the silicon nitride layer is formed by plasma-enhanced chemical vapor deposition.

16. The process according to claim 11, wherein the SiGe alloy comprises 10% to 50% of germanium.

17. The process according to claim 16, wherein the thin silicon oxide layer is formed by plasma-enhanced chemical vapor disposition.

18. The process according to claim 16, wherein the thin silicon dioxide layer has a thickness of 30 to 40 nm.

19. The process according to claim 16, wherein the silicon nitride layer is formed by plasma-enhanced chemical vapor deposition.

20. The process according to claim 16, wherein the SiGe alloy layer has a thickness of 20 to 50 nm.

21. The process according to claim 20, wherein the thin silicon dioxide layer has a thickness of 30 to 40 nm.

22. The process according to claim 20, wherein the silicon nitride layer is formed by plasma-enhanced chemical vapor deposition.

23. The process according to claim 20, wherein the thin silicon oxide layer is formed by plasma-enhanced chemical vapor disposition.

24. The process according to claim 23, wherein the silicon nitride layer is formed by plasma-enhanced chemical vapor deposition.

25. The process according to claim 23, wherein the thin silicon dioxide layer has a thickness of 30 to 40 nm.

26. The process according to claim 25, wherein the silicon nitride layer is formed by plasma-enhanced chemical vapor deposition.

27. A method for manufacturing a bipolar transistor comprising the steps of:

producing a structure comprising a semiconductor substrate in which an extrinsic collector, a lateral isolation region and an intrinsic collector region are formed, the structure having a main surface on which an amorphous silicon layer, defining a base window in the intrinsic collector region, and a layer that will form the future base of the transistor and covering the amorphous silicon layer and the base window, are deposited;

successively depositing, on the layer that will form the future base of the transistor, an SiGe alloy layer, a silicon oxide layer, and a silicon nitride layer;

etching the silicon nitride layer, the silicon oxide layer, and the SiGe alloy layer, in order to form, on the layer that will form the future base of the transistor, a false emitter of geometry and dimensions corresponding to the desired geometry and dimensions of the final emitter;

forming an extrinsic base region in the layer that will form the future base of the transistor;

forming a metal silicide layer on the extrinsic base region;

depositing a thick silicon dioxide layer so as to cover the metal silicide layer and the false emitter;

polishing the thick silicon dioxide layer down to the level of the false emitter;

a etching the false emitter in order to form an emitter window;

depositing a polysilicon layer filling the emitter window and covering the thick silicon dioxide layer; and etching the polysilicon layer in order to complete the emitter.

28. The method of claim 27, wherein the silicon nitride layer has a thickness of 200 to 300 nm.

29. The method of claim 27, wherein the etching of the false emitter is plasma etching.

30. The method of claim 29, wherein the various layers of the layer that will form the future base of the transistor are formed by non-selective epitaxy.

31. The method of claim 27, wherein the layer that will form the future base of the transistor comprises a stack of a first layer of amorphous silicon, a second layer of SiGe alloy and a third layer of doped silicon.

32. The method of claim 27, wherein the SiGe alloy comprises 10% to 50% of germanium.

33. The method of claim 27, wherein the SiGe alloy layer has a thickness of 20 to 50 nm.

34. The method of claim 27, wherein the silicon oxide layer is formed by plasma-enhanced chemical vapor disposition.

35. The method of claim 27, wherein the silicon dioxide layer has a thickness of 30 to 40 nm.

36. The method of claim 27, wherein the silicon nitride layer is formed by plasma-enhanced chemical vapor deposition.

37. The method of claim 27, wherein the SiGe alloy layer is formed by non-selective epitaxy.

* * * * *